US011094785B2

(12) United States Patent
Majhi et al.

(10) Patent No.: US 11,094,785 B2
(45) Date of Patent: Aug. 17, 2021

(54) DEUTERIUM-BASED PASSIVATION OF NON-PLANAR TRANSISTOR INTERFACES

(71) Applicant: INTEL CORPORATION, Santa Clara, CA (US)

(72) Inventors: Prashant Majhi, San Jose, CA (US); Glenn A. Glass, Portland, OR (US); Anand S. Murthy, Portland, OR (US); Tahir Ghani, Portland, OR (US); Aravind S. Killampalli, Beaverton, OR (US); Mark R. Brazier, Lake Oswego, OR (US); Jaya P. Gupta, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/876,528

(22) Filed: May 18, 2020

(65) Prior Publication Data

US 2020/0286996 A1 Sep. 10, 2020

Related U.S. Application Data

(63) Continuation of application No. 15/753,739, filed as application No. PCT/US2015/050921 on Sep. 18, 2015, now Pat. No. 10,692,974.

(51) Int. Cl.
*H01L 29/10* (2006.01)
*H01L 29/775* (2006.01)
(Continued)

(52) U.S. Cl.
CPC ...... *H01L 29/1054* (2013.01); *H01L 21/3003* (2013.01); *H01L 27/0924* (2013.01);
(Continued)

(58) Field of Classification Search
CPC ............. H01L 21/3003; H01L 27/0924; H01L 29/1054; H01L 29/0649; H01L 29/42392;
(Continued)

(56) References Cited

U.S. PATENT DOCUMENTS 9,385,195 B1 * 7/2016 Zhang ............... H01L 29/66795
9,716,046 B1 * 7/2017 Cheng ............... H01L 21/02236
(Continued)

FOREIGN PATENT DOCUMENTS

WO 2017048275 A1 3/2017

OTHER PUBLICATIONS

International Search Report and Written Opinion received for PCT/US2015/050921, dated Jun. 13, 2016. 13 pages.
(Continued)

*Primary Examiner* — Thao P Le
(74) *Attorney, Agent, or Firm* — Schwabe, Williamson & Wyatt, P.C.

(57) ABSTRACT

Techniques are disclosed for deuterium-based passivation of non-planar transistor interfaces. In some cases, the techniques can include annealing an integrated circuit structure including the transistor in a range of temperatures, pressures, and times in an atmosphere that includes deuterium. In some instances, the anneal process may be performed at pressures of up to 50 atmospheres to increase the amount of deuterium that penetrates the integrated circuit structure and reaches the interfaces to be passivated. Interfaces to be passivated may include, for example, an interface between the transistor conductive channel and bordering transistor gate dielectric and/or an interface between sub-channel semiconductor and bordering shallow trench isolation oxides. Such interfaces are common locations of trap sites that may include impurities, incomplete bonds dangling bonds, and broken bonds, for example, and thus such interfaces can benefit
(Continued)

from deuterium-based passivation to improve the performance and reliability of the transistor.

17 Claims, 6 Drawing Sheets

(51) Int. Cl.
*H01L 21/30* (2006.01)
*H01L 29/78* (2006.01)
*H01L 29/423* (2006.01)
*H01L 29/786* (2006.01)
*H01L 27/092* (2006.01)
*H01L 29/06* (2006.01)
*H01L 21/8238* (2006.01)

(52) U.S. Cl.
CPC .... *H01L 29/0649* (2013.01); *H01L 29/42392* (2013.01); *H01L 29/775* (2013.01); *H01L 29/785* (2013.01); *H01L 29/7827* (2013.01); *H01L 29/78696* (2013.01); *H01L 21/823807* (2013.01); *H01L 21/823821* (2013.01); *H01L 29/0673* (2013.01)

(58) Field of Classification Search
CPC . H01L 29/775; H01L 29/7827; H01L 29/785; H01L 29/78696

USPC .......................................................... 257/401
See application file for complete search history.

(56) References Cited

U.S. PATENT DOCUMENTS

| | | |
|---|---|---|
| 2005/0255684 A1 | 11/2005 | Koldiaev et al. |
| 2006/0270192 A1 | 11/2006 | Cheng |
| 2008/0054361 A1* | 3/2008 | Siprak .................. H01L 21/845 257/365 |
| 2008/0111185 A1* | 5/2008 | Cheng .................. H01L 29/785 257/347 |
| 2011/0068407 A1 | 3/2011 | Yeh et al. |
| 2012/0273894 A1 | 11/2012 | Chen et al. |
| 2013/0052782 A1 | 2/2013 | Flachowsky et al. |
| 2014/0027816 A1 | 1/2014 | Cea et al. |
| 2014/0206181 A1 | 7/2014 | Cheng et al. |
| 2014/0225116 A1 | 8/2014 | Ramkumar et al. |
| 2018/0248004 A1 | 8/2018 | Majhi et al. |
| 2020/0006063 A1* | 1/2020 | Chen ................ H01L 21/02321 |

OTHER PUBLICATIONS

International Preliminary Report on Patentability received for PCT/US2015/050921, dated Mar. 29, 2018. 10 pages.
Office Action from Taiwan Patent Application No. 105124478, dated Jan. 13, 2021, 7 pgs.

* cited by examiner

DEUTERIUM-BASED PASSIVATION OF NON-PLANAR TRANSISTOR INTERFACES

CROSS-REFERENCE TO RELATED APPLICATIONS

This patent application is a Continuation of U.S. patent application Ser. No. 15/753,739, filed Feb. 20, 2018, which is a U.S. National Phase Application under 35 U.S.C. § 371 of International Application No. PCT/US2015/050921, filed on Sep. 18, 2015, the entire contents of which is hereby incorporated by reference herein.

BACKGROUND

A finFET is a transistor built around a thin strip of semiconductor material (generally referred to as the fin). The transistor includes the standard field-effect transistor (FET) nodes, including a gate, a gate dielectric, a source region, and a drain region. The conductive channel of the device resides on the outer sides of the fin beneath the gate dielectric. Specifically, current runs along/within both sidewalls of the fin (sides perpendicular to the substrate surface) as well as along the top of the fin (side parallel to the substrate surface). Because the conductive channel of such configurations essentially resides along the three different outer, planar regions of the fin, such a finFET design is sometimes referred to as a tri-gate transistor. The finFET is an example of a non-planar transistor configuration. Other types of non-planar configurations are also available, such as: so-called double-gate finFETs, in which the conductive channel principally resides only along the two sidewalls of the fin (and not along the top of the fin); vertical channel FETs, in which vertical fins or wires include a gate separating the source and drain; and nanowire or nanoribbon FETs, in which the gate is all around one or more conductive channels. There exists a number of non-trivial issues associated with non-planar transistors.

DETAILED DESCRIPTION

Figure 1A:
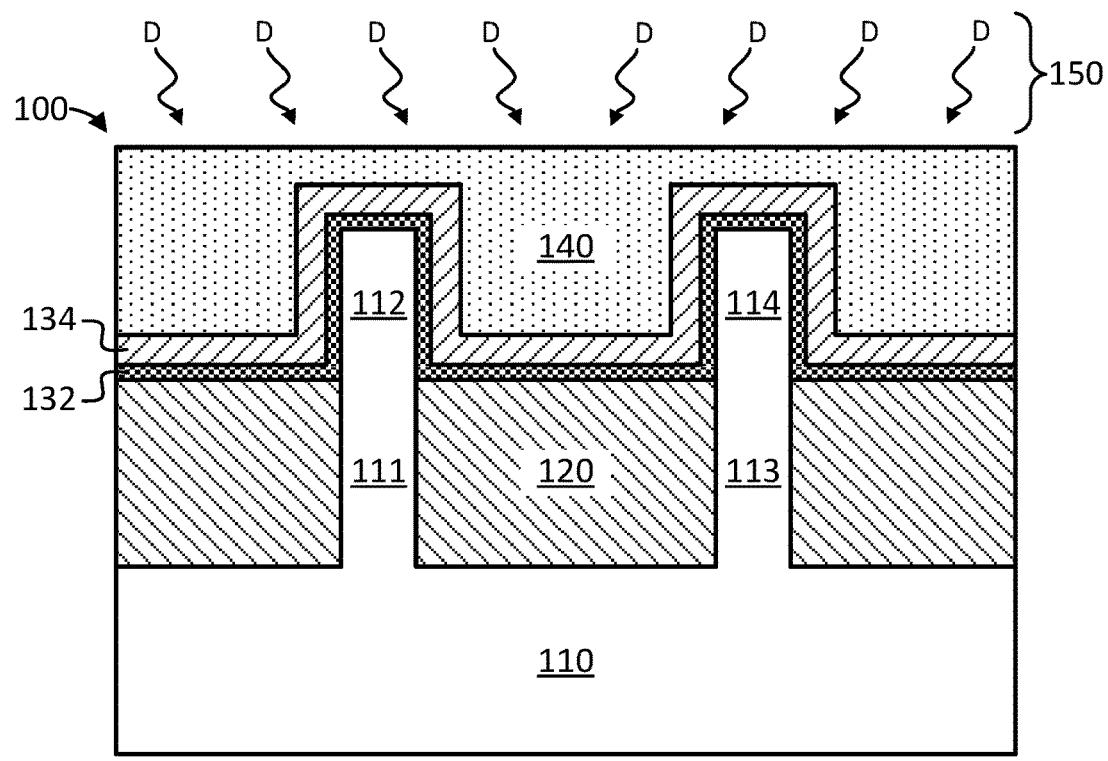
FIGS. 1A-B illustrate a deuterium-based passivation of an integrated circuit including finned transistors, in accordance with an embodiment of the present disclosure.

Techniques are disclosed for deuterium-based passivation of non-planar transistor interfaces. In some cases, the techniques can include annealing an integrated circuit structure including the transistor in a range of temperatures, pressures, and times in an atmosphere that includes deuterium (and possibly hydrogen and/or other materials). In some instances, the anneal process may be performed at pressures of up to 50 atmospheres to increase the amount of deuterium that penetrates the integrated circuit structure and reaches the interfaces to be passivated. Interfaces to be passivated may include, for example, an interface between the transistor conductive channel and bordering transistor gate dielectric and/or an interface between sub-channel semiconductor and bordering shallow trench isolation oxides. Such interfaces are common locations of trap sites that may include impurities, incomplete bonds dangling bonds, and broken bonds, for example, and thus such interfaces can benefit from deuterium-based passivation to improve the performance and reliability of the transistor. Numerous variations and configurations will be apparent in light of this disclosure.

General Overview

During the formation of finFETs and other non-planar transistor structures, impurities or defects form at the interface of the gate stack and the conductive channel. Such defects may include dangling bonds or interface traps, and such defects may also form in the sub-fin region, at the interface of the fin and the isolation material, as well as other high density interface states. For example, dangling bonds at the interface of the channel and gate dielectric can generate an interface charge that contributes to the transistor threshold voltage (Vt). Therefore, variations in the interface charge can cause variations in Vt, resulting in undesired transistor instability. The impurities formed can be passivated to minimize their impact on transistor performance and reliability. However, the impurities may be formed after the interface is formed, making it difficult to get to those interfaces for passivation purposes. In addition, as gate dielectric layers get thinner and thinner (e.g., to thicknesses of less than 5 nm), the channel between them becomes more difficult to passivate. Techniques such as sub-atmospheric hydrogen based passivation are limited in their efficiency to passivate the gate stack and junction/isolation interfaces in highly scaled non-planar transistors.

Thus, and in accordance with one or more embodiments of the present disclosure, techniques are disclosed for deuterium-based passivation of non-planar transistor interfaces. The interfaces to be passivated include, but are not limited to: the interface between the conductive channel and the gate stack (e.g., the interface between the channel material and the gate dielectric); and the interface between the sub-channel semiconductor material and bordering isolation material (e.g., the interface between sub-fin regions and surrounding oxide material). As previously described, such interfaces may include impurities or defects (e.g., dangling bonds, interface traps, etc.) as a result of, for example, high density at those interfaces and/or the transistor structures being highly scaled. The impurities and defects can negatively affect transistor performance and reliability, causing issues such as, for example, increased off-state leakage and parasitic capacitance. In some embodiments, the techniques include annealing the non-planar transistor structures in an atmosphere that includes deuterium (D), such that the deuterium penetrates the structure and reaches the interfaces to be passivated. When the deuterium reaches the interfaces that include, for example, incomplete bonds and/or ions, the deuterium can react with those interface defects in the semiconductor material, such as silicon (Si), to form silicon-deuterium (Si-D) bonds, thereby reducing and stabilizing the interface charge.

In some embodiments, the anneal process used for the deuterium passivation may include increased amounts of pressure, such as up to 50 atmospheres (e.g., 10, 20, 30, 40, or 50 atmospheres of pressure), to increase the amount of deuterium that penetrates the integrated circuit structure to reach the interfaces to be passivated. In some such embodiments, the amount of pressure used in the anneal process may be based on what stage in the integrated circuit/transistor formation process flow the anneal is performed. For example, in some embodiments, the anneal process can be performed during or after back end processing, such as after the transistors get interconnected with wiring. In some such embodiments, the timing for performing the passivation techniques may be selected to prevent exposure of the passivated interfaces to the high temperature processing that typically occurs during back end processing. Further, in some such embodiments, the deuterium may have to pass through 1, 2, 3, or more metal lines/levels before reaching the interfaces to be passivated, and thus, increased amounts of pressure may be used to ensure the deuterium atoms reach the interfaces to be passivated. In some embodiments, hydrogen (H) may be used in conjunction with or in the alternative to deuterium. Use of deuterium during the passivation techniques may be desired in comparison to hydrogen, for example, because Si-D bonds may be more stable than Si—H bonds.

The passivation techniques variously described herein can benefit numerous different transistor configurations and geometries. For example, in some embodiments, the passivation techniques can be used in the formation of finned transistor configurations (such as finFETs and trigate transistors), nanowire/nanoribbon transistor configurations (also referred to as gate-all-around transistors), dual gate transistor configurations, vertical channel transistor configurations (such as vertical channel FETs), and tunneling transistor configurations (such as tunnel FETs). Further, in some such embodiments, the passivation techniques can be applied to transistor configurations including sub-fin isolation, variable fin heights, or other variations, depending on the end use or target application. In some embodiments, the passivation techniques can also be used with planar transistor configurations. In some embodiments, the passivation techniques can be used with various channel types or various type metal-oxide-semiconductor (MOS) transistor configurations, such as p-MOS, n-MOS, and/or complementary MOS (CMOS). In some embodiments, the semiconductor material or channel material at the interface to be passivated may include Si, germanium (Ge), SiGe, and/or one or more III-V materials. In some such embodiments the non-semiconductor material at the interface to be passivated may be an oxide material (e.g., silicon dioxide) and/or a high-k dielectric material (e.g., hafnium silicate, zirconium silicate, hafnium dioxide, zirconium dioxide).

The passivation techniques can provide numerous benefits, as will be apparent in light of the present disclosure. For example, high density interface states, such as the interface between a transistor gate stack and the transistor channel, can be passivated to improve transistor performance and reliability. Further, the techniques can be used for highly scaled transistors (e.g., where the gate dielectric is less than 5 nm, or less than 3 nm) and future scaling, including unique channel and gate stack materials. Further yet, the passivation techniques can be applied to junction and isolation interfaces to minimize the off-state leakage by saturating dangling bonds at semiconductor/oxide interfaces. Further still, the passivation techniques can be used with numerous different transistor configurations and materials, including the configurations and materials described herein.

Upon analysis (e.g., using scanning/transmission electron microscopy (SEM/TEM), composition mapping, secondary ion mass spectrometry (SIMS), time-of-flight SIMS (ToF-SIMS), atom probe imaging, local electrode atom probe (LEAP) techniques, 3D tomography, high resolution physical or chemical analysis, etc.), a structure or device configured in accordance with one or more embodiments will effectively show deuterium passivation at one or more transistor interfaces as variously described herein. For example, in some cases, deuterium may be located at the interface between a non-planar transistor gate stack and channel. Further, in some cases, deuterium may be located at junction and isolation interfaces. In some such cases, the passivation techniques can introduce deuterium at the junction/isolation interfaces to, for example, minimize the off state leakage by saturating dangling bonds at such semiconductor/oxide interfaces. In some cases, the passivation techniques and devices including deuterium at the interfaces variously described herein may be detected by measuring device performance. For example, in some such cases, parasitic capacitance may be reduced and/or the density of interface traps may be reduced. Numerous configurations and variations will be apparent in light of this disclosure.

Architecture and Methodology

Figure 1B:
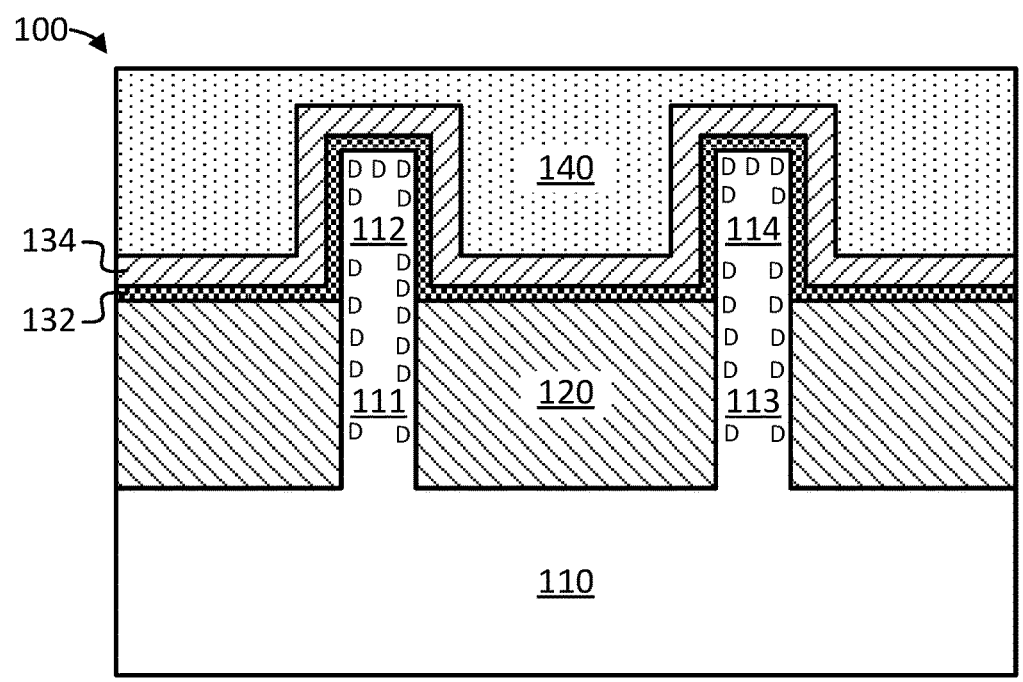

FIGS. 1A-B illustrate a deuterium-based passivation of an integrated circuit 100 including finned transistors, in accordance with an embodiment of the present disclosure. As can be seen, in this example embodiment, two finned transistor devices are shown at the cross section of the gate stack (including gate dielectric 132 and gate electrode 134) and channel regions 112 and 114. The transistors are formed on substrate 110 and separated by isolation material 120, such as shallow trench isolation material (STI) that will be described in more detail below. The finned transistor devices each also include source and drain (S/D) regions, where the S/D regions are on either side of channel regions 112 and 114. For example, in the case of the transistor device including channel region 112, one of the source and drain would be located behind the channel region 112 (going into the page), and the other of the source and drain would be located in front of the channel region 112 (coming out from the page), as is the typical case for finned transistor configurations, such as finFET and trigate transistor devices. The passivation techniques will be primarily described with reference to integrated circuit 100 illustrated in FIGS. 1A-B. However, the passivation techniques are also illustrated with numerous other different transistor configurations, as will be described in more detail with reference to FIGS. 2A-B, 3A-B, 4A-B, and 5A-B.

In some embodiments, substrate 110 may be: a bulk substrate including, e.g., Si, SiGe, Ge, and/or at least one III-V material; an X on insulator (XOI) structure where X is Si, SiGe, Ge, and/or at least one III-V material and the insulator material is an oxide material or dielectric material or some other electrically insulating material; or some other suitable multilayer structure where the top layer includes Si, SiGe, Ge, and/or at least one III-V material. In the example embodiment of FIGS. 1A-B, fins 111/112 and 113/114 are formed from and are native to substrate 110, with the left fin including active channel region 112 and sub-fin portion 111 and the right fin including active channel region 114 and sub-fin portion 113. The formation of the fins may have included any suitable process(es). An example process flow to form the fins may include: patterning the substrate 110 with hardmask in areas to be formed into fins, etching the areas that are not masked off to form shallow trench recesses, and depositing shallow trench isolation (STI) material 120 in the recesses. In such an example process flow, additional techniques may be used to form a substrate including fins, such as planarization processes, additional etch processes, or any other suitable process depending on the end use or target application. In some embodiments, one or more of the fins may be at least partially removed and replaced via etch and deposition processes, respectively, where the new fin material may be the same as or different than the substrate material 110, such that channel portion of the fin is formed on substrate 110 and includes the new fin material.

In some embodiments, fins 111/112 and 113/114 may be formed to have varying widths and heights. For example, in an aspect ratio trapping (ART) integration scheme, the fins may be formed to have particular height to width ratios such that when they are later removed or recessed, the resulting trenches formed allow for defects in the replacement material deposited to terminate on a side surface as the material grows vertically, such as non-crystalline/dielectric sidewalls, where the sidewalls are sufficiently high relative to the size of the growth area so as to trap most, if not all, of the defects. An integrated circuit structure including fins of varying heights will be described in more detail herein, with reference to FIGS. 3A-B. In such an example case, the height to width ratio (h/w) of the fins may be greater than 1, such as 1.5 to 3, for example. Note that although only two fins are shown on integrated circuit 100 for illustrative purposes, any number of fins may be formed, such as one, five, ten, hundreds, thousands, millions, etc., depending on the end use or target application In some embodiments, fins 111/112 and 113/114 may be formed of various different materials, such as Si, Ge, SiGe, and/or one or more III-V materials, whether the fins are native to the substrate 110 or formed on substrate 110 of a new fin material. Example III-V materials, as variously used herein, can include gallium arsenide (GaAs), indium phosphide (InP), indium arsenide (InAs), indium gallium arsenide (InGaAs), aluminum arsenide (AlAs), or indium aluminum arsenide (InAlAs), or any other suitable III-V material. In some embodiments, if the fins are replaced with one or more III-V materials, the material may include a single layer or a multilayer stack of III-V materials, and such multilayer stacks may include: InP/InGaAs/InAs; GaAs/InP/InAs; GaAs/InGaAs/InAs; GaAs/InAlAs/InAs; InP/InGaAs/InP; GaAs/InAs; GaAs/InGaAs; or InP/InGaAs; or any other suitable multilayer stack including two or more III-V materials. In some such embodiments where the fins include a III-V multilayer stack, a high bandgap III-V material may be used near the bottom of the stack (e.g., to help reduce leakage current to ground), such as GaAs, InP, InAlAs, or AlAs, for example. Further, in some such embodiments, a III-V multilayer stack may employ a low bandgap III-V material near the top of the stack (e.g., to help with making contact to the stack in the source and drain regions), such as InAs or InGaAs, for example. In some embodiments, the fin material may be strained and/or doped in any suitable manner, depending on the end use or target application. For example, in some embodiments, where the channel regions of the fins (e.g., 112 and/or 114) include Si or at least one III-V material, such channel regions may be p-type doped to form, for example, n-MOS transistors. Further, in some embodiments, where the channel regions of the fins (e.g., 112 and/or 114) include SiGe or Ge, such channel regions may be n-type doped to, for example, form p-MOS transistors. In an example embodiment, channel region 112 may be n-type doped and channel region 114 may be p-type doped, such that the two transistors formed using the respective channel regions 112 and 114 may be combined to form a CMOS device.

In this example embodiment, integrated circuit 100 includes isolation regions 120 (or STI regions) that are formed between sub-fin portions 111 and 113 to prevent or minimize electric current leakage between the adjacent semiconductor devices formed from respective channel regions 112 and 114. STI material 120 may include any suitable insulating material, such as one or more dielectric, oxide (e.g., silicon dioxide), or nitride (e.g., silicon nitride) materials. In some embodiments, the STI material 120 may be selected based on the material of substrate 110. For example, in the case of a Si substrate 110, STI material 120 may be silicon dioxide or silicon nitride.

In this example embodiment, integrated circuit 100 includes a gate stack including gate dielectric 132 formed directly on the fin channel regions 112 and 114. The gate stack also includes a gate electrode 134 formed on the gate dielectric. As can also be seen in this example embodiment, integrated circuit 100 also includes a gate fill material 140 formed on the gate electrode. The gate dielectric and gate electrode may be formed using any suitable technique and from any suitable materials. For example, in some embodiments, the formation of the gate stack may include dummy gate oxide deposition, dummy gate electrode (e.g., poly-Si) deposition, and patterning hardmask deposition. Additional processing may include patterning the dummy gates and depositing/etching spacer material. Following such processes, the method may continue with insulator deposition, planarization, and then dummy gate electrode and gate oxide removal to expose the channel region of the transistors, such as is done for a replacement metal gate (RMG) process. Following opening the channel region, the dummy gate oxide and electrode may be replaced with, for example, a hi-k dielectric and a replacement metal gate, respectively. Other embodiments may include a standard gate stack formed by any suitable process. Any number of standard back-end processes may also be performed to help complete the formation of one or more transistors.

In some embodiments, the gate dielectric 132 may be, for example, any suitable oxide material (such as silicon dioxide) or a high-k gate dielectric material. Examples of high-k gate dielectric materials include, for instance, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used. In general, the thickness of the gate dielectric 132 should be sufficient to electrically isolate the gate electrode from the source and drain contacts. In some embodiments, the gate dielectric may have a thickness of 0.5 to 3 nm, or any other suitable thickness, depending on the end use or target application. In some embodiments, the gate electrode 134 may include a wide range of materials, such as polysilicon, silicon nitride, silicon carbide, or various suitable metals or metal alloys, such as aluminum (Al), tungsten (W), titanium (Ti), tantalum (Ta), copper (Cu), titanium nitride (TiN), or tantalum nitride (TaN), for example. In embodiments where gate electrode 134 includes metal, the metal gate electrode can be variable workfunction (e.g., to assist with tuning to the proper threshold voltage of the device). In some embodiments, gate fill material 140 may be any suitable material, such as a suitable metal material (e.g., tungsten or cobalt). The integrated circuit structure 100 of FIG. 1A may include additional layers and components than what is shown, such as metal interconnects/wiring/lines; however, the integrated circuit structure 100 illustrated in FIG. 1A is being used to describe the passivation techniques for ease of description.

As can be seen in FIG. 1A, the passivation techniques are being performed in this example embodiment via an annealing process 150 in an atmosphere including deuterium D. FIG. 1B illustrates the resulting structure after anneal 150 has been performed. As shown in FIG. 1B, atoms of deuterium D have passivated defects (e.g., dangling bonds) at the interfaces between: 1) channel regions 112/114 and gate dielectric 132; and 2) sub-fin regions 111/113 and STI material 120. As previously described, the interfaces are common locations of trap sites that include impurities, incomplete bonds, dangling bonds, and broken bonds, for example, and therefore the interfaces can benefit from passivation via the techniques variously described herein. Note that although the deuterium D atoms are shown as being located in semiconductor material fins 111/112 and 113/114 for ease of illustration. However, in various embodiments, such deuterium D atoms may be located in any combination of the following: at the aforementioned interfaces (e.g., where at least a majority of an atom is between the semiconductor material and the oxide/high-k dielectric material); in the semiconductor material (e.g., where at least a majority of an atom is located in the semiconductor fins 111/112 or 113/114); and/or in the oxide/high-k dielectric material (e.g., where at least a majority of an atom is located in gate dielectric 132 or STI material 120. In some embodiments, deuterium may also be located in other portions of integrated circuit structure 100. As previously described, in some embodiments, hydrogen may be used in place of (or in addition to) deuterium, such that anneal process 150 would be performed in an atmosphere including hydrogen and therefore hydrogen would also or alternatively be found at the interfaces described as including deuterium in FIG. 1B.

The anneal process may be performed at various suitable temperatures, pressures, and times, using deuterium D or a mixture of gases that include deuterium D (e.g., nitrogen mixed with deuterium). In some embodiments, anneal process 150 may be a high pressure anneal process (HPAP), with pressures ranging from 1-50 atmospheres (e.g., 10-50 atmospheres). In some such embodiments, the pressure used for anneal process 150 may be based on the integrated circuit structure being annealed and/or the stage in the integrated circuit process flow that the anneal is being performed. For example, if anneal 150 is performed later in the process flow (e.g., after or toward the end of back-end processing), then increased pressures (e.g., greater than 5, 10, 15, 20, or 25 atmospheres) may be used to ensure that the deuterium penetrates integrated circuit 100 and reaches the interfaces to be passivated. In some embodiments, anneal 150 may be performed for 0.5 to 6 hours, or for some other suitable duration of time. In some embodiments, anneal 150 may be performed by heating at a temperature within the range of 300° C. and 700° C. In some embodiments, lower temperatures may be used for anneal 150, such as less than 500° C., less than 450° C., less than 400° C., or less than some other suitable temperature ceiling. In some such embodiments, the temperature ceiling may be determined based on the stage in the integrated circuit process flow that anneal 150 is performed. For example, if anneal 150 is performed after metal interconnects/wiring/lines have been formed on integrated circuit 100, annealing at temperatures exceeding 400° C. to 500° C. may not be practical, as the aluminum and copper alloys commonly used for such metal interconnects/wiring/lines melt at temperatures greater than about 400° C. to 500° C., depending on the specific composition used. In some embodiments, the temperature, pressure, and time used for anneal 150 may be based on the integrated circuit structure being annealed, the composition of the gas used during the process, the stage in the integrated circuit process flow that the anneal is being performed, and/or the other two of the temperature, pressure, and time used for the process, for example.

Figure 2A:
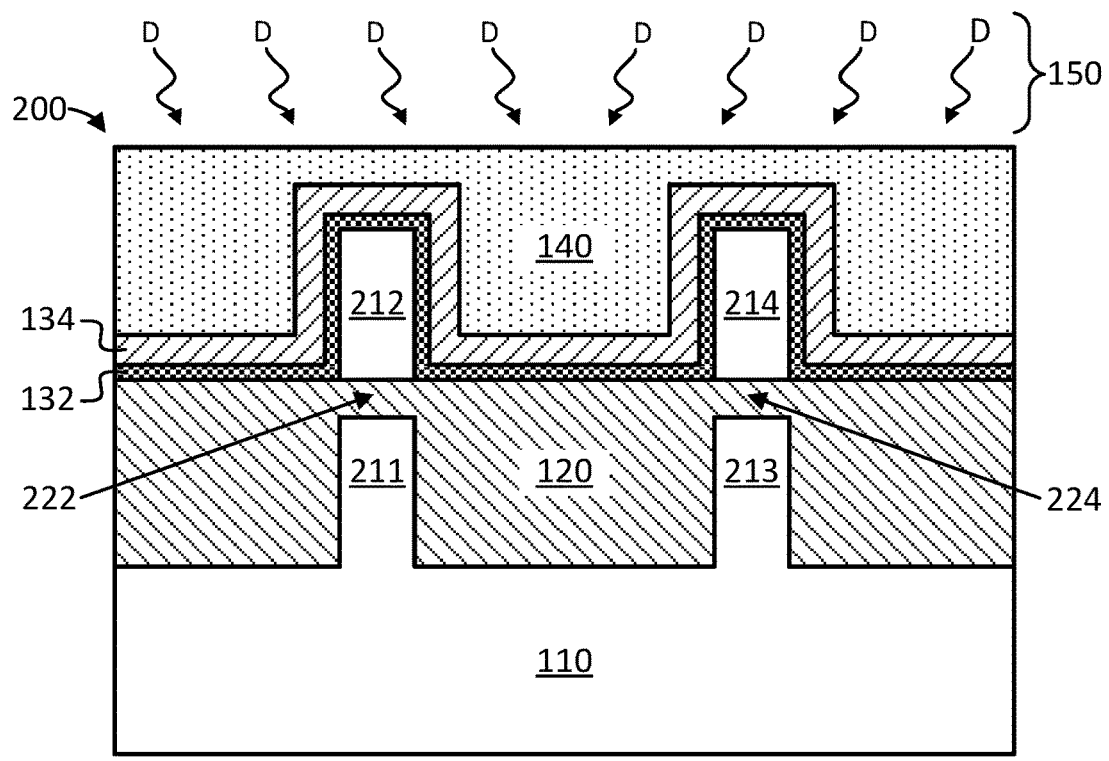
FIGS. 2A-B illustrate a deuterium-based passivation of an integrated circuit including finned transistors having sub-fin isolation, in accordance with an embodiment of the present disclosure.
Figure 2B:
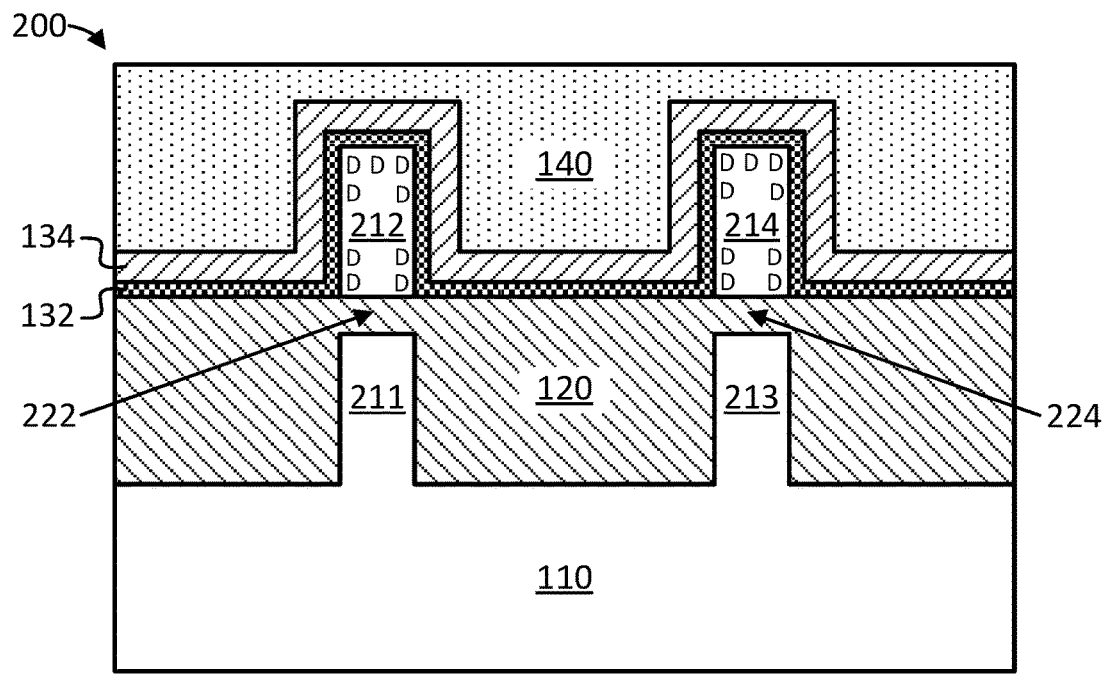

FIGS. 2A-B illustrate a deuterium-based passivation of an integrated circuit 200 including finned transistors having sub-fin isolation, in accordance with an embodiment of the present disclosure. The previous discussion with respect to integrated circuit 100 and anneal process 150 is equally applicable to integrated circuit 200, such that only the differences between the structure of integrated circuit 100 and 200 will be described. Primarily, the difference between integrated circuit structures 100 and 200 is that the fins of structure 100 include sub-fin isolation 222, 224 in structure 200. In other words, channel regions 212 and 214 are similar to channel regions 112 and 114, respectively, except that channel regions 212 and 214 are isolated from sub-fin portions 211 and 213, respectively, via sub-fin isolation regions 222 and 224, respectively. As can be seen, isolation regions are portions of STI region 120, and are thus formed of the same material, in this example embodiment. However, in other embodiments, the isolation regions 222 and 224 may be separate from STI region(s) 120 and may further include different materials. Any suitable techniques may have been used for such sub-fin isolation, leading to isolation regions 222 and 224 below channel regions 212 and 214, respectively. Note that channel regions 212 and 214 are above substrate 110 in this example embodiment and are not native to substrate 110, as there is a separation caused by isolation regions 222 and 224. Recall that channel regions 212 and 214 may include the same material as substrate 110 or the channel regions may include different materials, depending on the end use or target application. Also recall that channel regions 212 and 214 may be used for transistors having finned configurations, such as finFET or trigate transistors. As can be seen in FIG. 2B, in this example embodiment, the deuterium D atoms are only shown passivating the interfaces between the channel regions 212, 214 and gate dielectric 132. In other words, the deuterium D did not reach the interfaces between sub-fin regions 211, 213 and STI material 120. This may have been as a result of the presence of isolation regions 222 and 224 hindering the penetration of the deuterium D atoms. However, in some embodiments, the deuterium D atoms (or hydrogen atoms, when hydrogen is used) may also passivate the 211/120 and 213/120 interfaces (as well as the 211/222 and 213/224 interfaces).

Figure 3A:
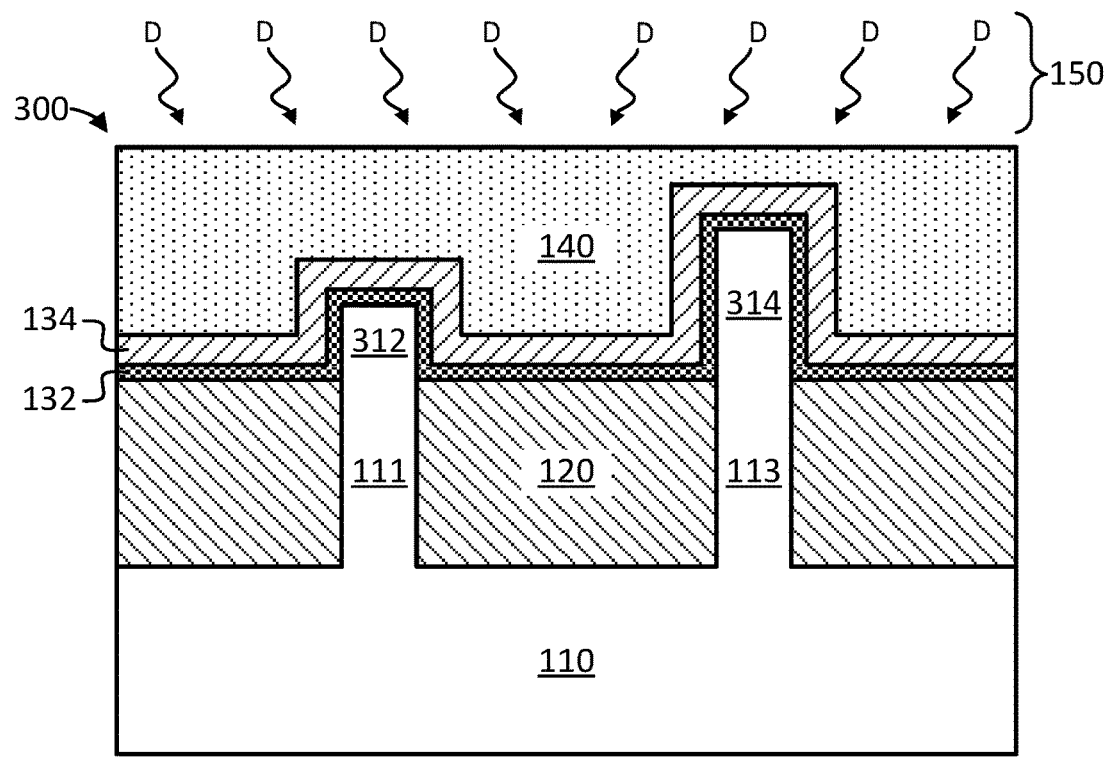
FIGS. 3A-B illustrate a deuterium-based passivation of an integrated circuit including finned transistors having variable fin heights, in accordance with an embodiment of the present disclosure.
Figure 3B:
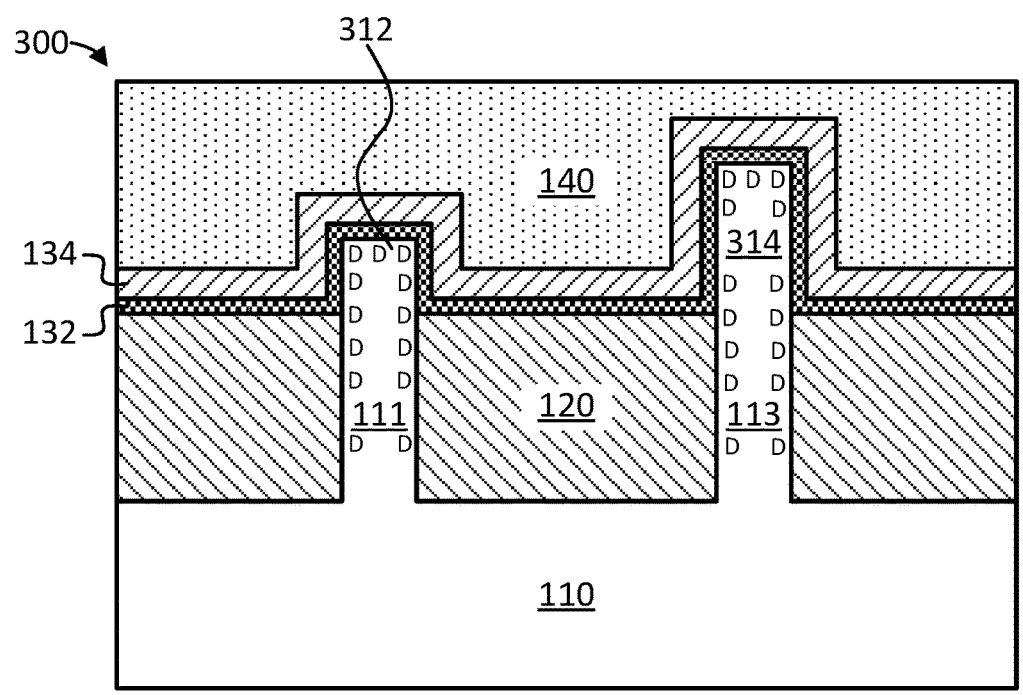

FIGS. 3A-B illustrate a deuterium-based passivation of an integrated circuit 300 including finned transistors having variable fin heights, in accordance with an embodiment of the present disclosure. The previous discussion with respect to integrated circuit 100 and anneal process 150 is equally applicable to integrated circuit 300, such that only the differences between the structure of integrated circuit 100 and 300 will be described. Primarily, the difference between integrated circuit structures 100 and 300 is that the fins of structure 100 are varied in height. More specifically, the channel region 312 of the left fin 111/312 is shorter than the channel region 314 of the right fin 113/314. As previously described, fins may have varying heights and thicknesses, depending on the end use or target application. Varying fin heights may be helpful for applications such as memory applications (e.g., static random access memory (SRAM) applications), system-on-chip (SOC) applications, or other suitable applications as will be apparent in light of the present disclosure. In this example embodiment, channel region 314 is roughly twice the height of channel region 312; however, any suitable variations in fin height may be used, depending on the end use or target application. For example, in some embodiments, the difference in the first fin height (whether it be total fin height or only the fin height of the active channel region) is at least 1.2, 1.5, 2, 3, 4, or 5 times greater than the second fin height, or some other suitable minimum difference in height.

Figure 4A:
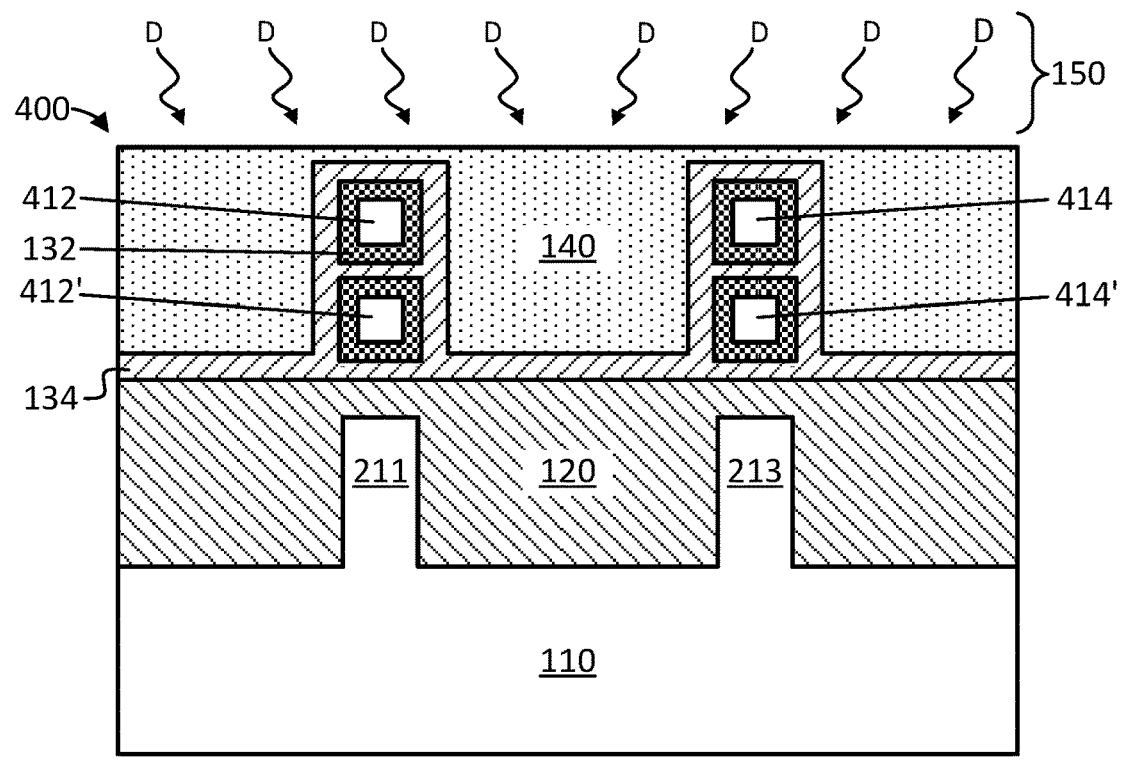
FIGS. 4A-B illustrate a deuterium-based passivation of an integrated circuit including nanowire transistors, in accordance with an embodiment of the present disclosure.
Figure 4B:
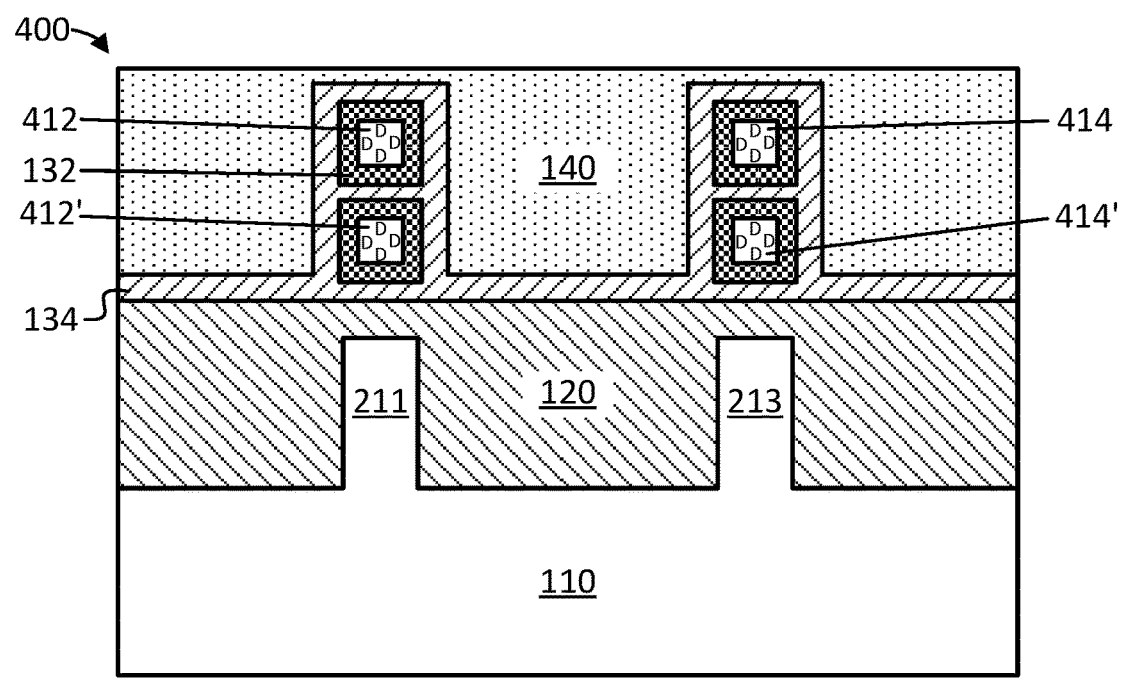

FIGS. 4A-B illustrate a deuterium-based passivation of an integrated circuit 400 including nanowire transistors, in accordance with an embodiment of the present disclosure. The previous discussion with respect to integrated circuit 100 and anneal process 150 is equally applicable to integrated circuit 400, such that only the differences between the structure of integrated circuit 100 and 400 will be described. Primarily, the difference between integrated circuit structures 100 and 400 is that integrated circuit structure 400 includes transistors having nanowire configurations. A nanowire transistor (sometimes referred to as a gate-all-around or nanoribbon transistor) is configured similarly to a fin-based transistor, but instead of a finned channel region where the gate is on three sides (and thus, there are three effective gates), one or more nanowires are used and the gate material generally surrounds each nanowire on all sides. Depending on the particular design, some nanowire transistors have, for example, four effective gates. As can be seen in the example structure of FIG. 4A, the channel regions each have two nanowires 412/412' and 414/414', although other embodiments can have any number of nanowires, such as one, three, five, ten, etc. The nanowires may have been formed while the channel regions were exposed during a replacement gate process (e.g., an RMG process), after the dummy gate is removed, for example. As can be seen in FIGS. 4A-B, anneal process 150 performed in FIG. 4A caused deuterium D atoms to passivate the interfaces between the nanowire channels 412, 412', 414, 414' and the gate dielectric 132. Recall that in some embodiments, hydrogen may be used in combination with or in the alternative to deuterium. As can also be seen in FIGS. 4A-B, sub-fin portions 211 and 213 are similar to those described above in integrated circuit structure 200, such that they are isolated from nanowire channel regions 412/412' and 414/414', respectively, and the sub-fin portions 211 and 213 have not been passivated. The previous discussion with respect to sub-fin portions 211 and 213 in integrated circuit 200 is equally applicable to integrated circuit 400.

Figure 5A:
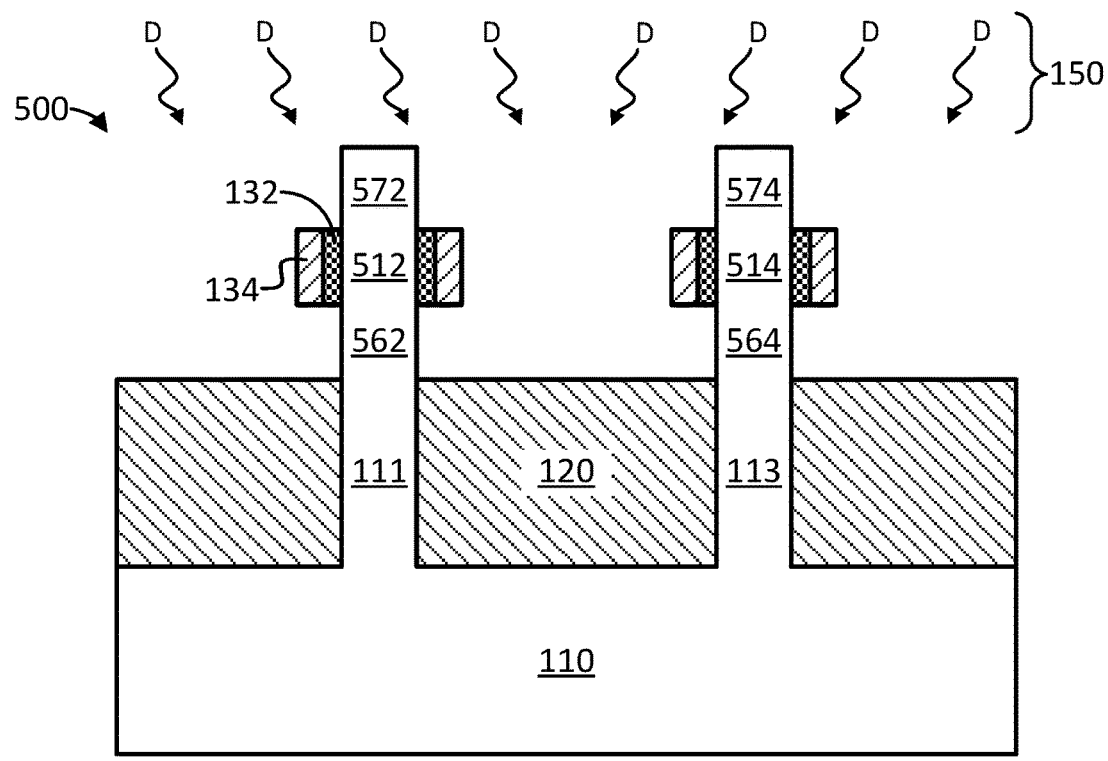
FIGS. 5A-B illustrate a deuterium-based passivation of an integrated circuit including vertical channel transistors, in accordance with an embodiment of the present disclosure.
Figure 5B:
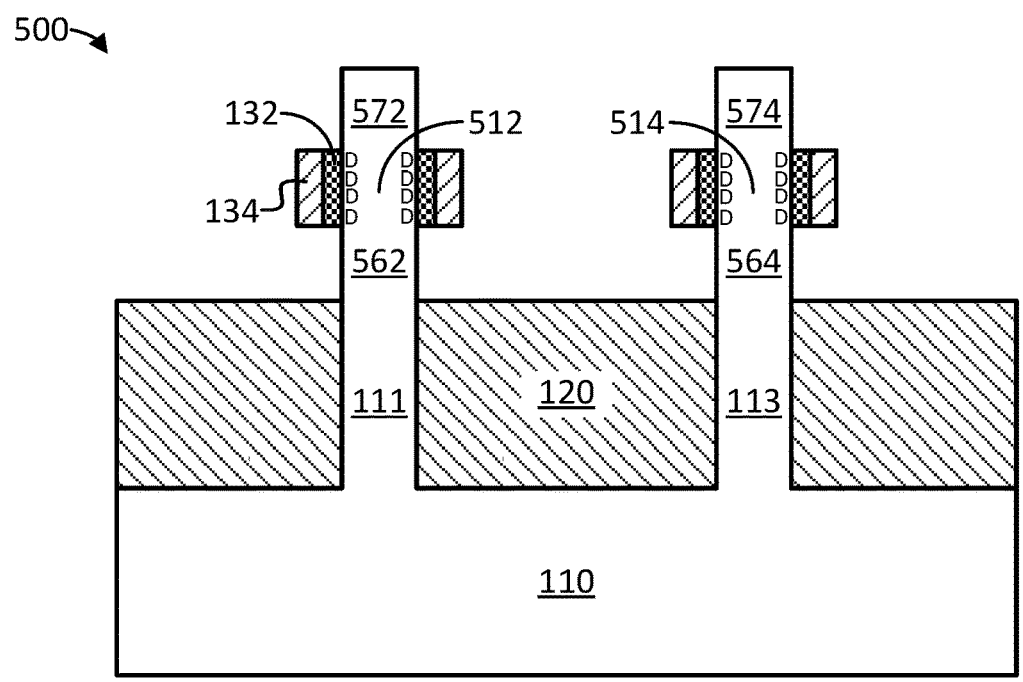

FIGS. 5A-B illustrate a deuterium-based passivation of an integrated circuit 500 including vertical channel transistors, in accordance with an embodiment of the present disclosure. The previous discussion with respect to integrated circuit 100 and anneal process 150 is equally applicable to integrated circuit 500, such that only the differences between the structure of integrated circuit 100 and 500 will be described. Primarily, the difference between integrated circuit structures 100 and 500 is that integrated circuit structure 500 includes transistors having vertical channel configurations. As can be seen in FIG. 5A, integrated circuit 500 includes a left fin, where the transistor formed on the fin includes channel region 512 and source/drain regions 562 and 572, and a right fin, where the transistor formed on the fin includes channel region 514 and source/drain regions 564 and 574. In this example embodiment, and as is commonly the case with vertical channel transistors (e.g., vertical channel finFETs), dielectric 132 and gate electrode 134 wrap completely around the fins at the channel regions 512 and 514. Although fins 562/512/572 and 564/514/574 are native to substrate 110 in this example embodiment, they need not be in other embodiments (e.g., where at least a portion of the fin used for the transistor is replaced). As can be seen in FIGS. 5A-B, anneal 150 causes the interfaces between channel regions 512 and 514 and gate dielectric 132 to be passivated with atoms of deuterium D. Note that deuterium atoms are not present at the interfaces between sub-fin regions 111, 113 and STI regions 120 in this example embodiment; however, in some embodiments, those interfaces may be passivated with deuterium as well. Recall that in some embodiments, hydrogen may be used in combination with or in the alternative to deuterium for the passivation techniques variously described herein.

The integrated circuit structures 100, 200, 300, 400, and 500 shown in FIGS. 1A-B, 2A-B, 3A-B, 4A-B, and 5A-B, respectively, are provided as examples and are not intended to limit the present disclosure. Numerous variations and configurations will be apparent in light of the present disclosure. For example, in some embodiments, the passivation techniques can be used with tunnel FETs or any other suitable transistor configurations, depending on the end use or target application.

Example System

Figure 6:
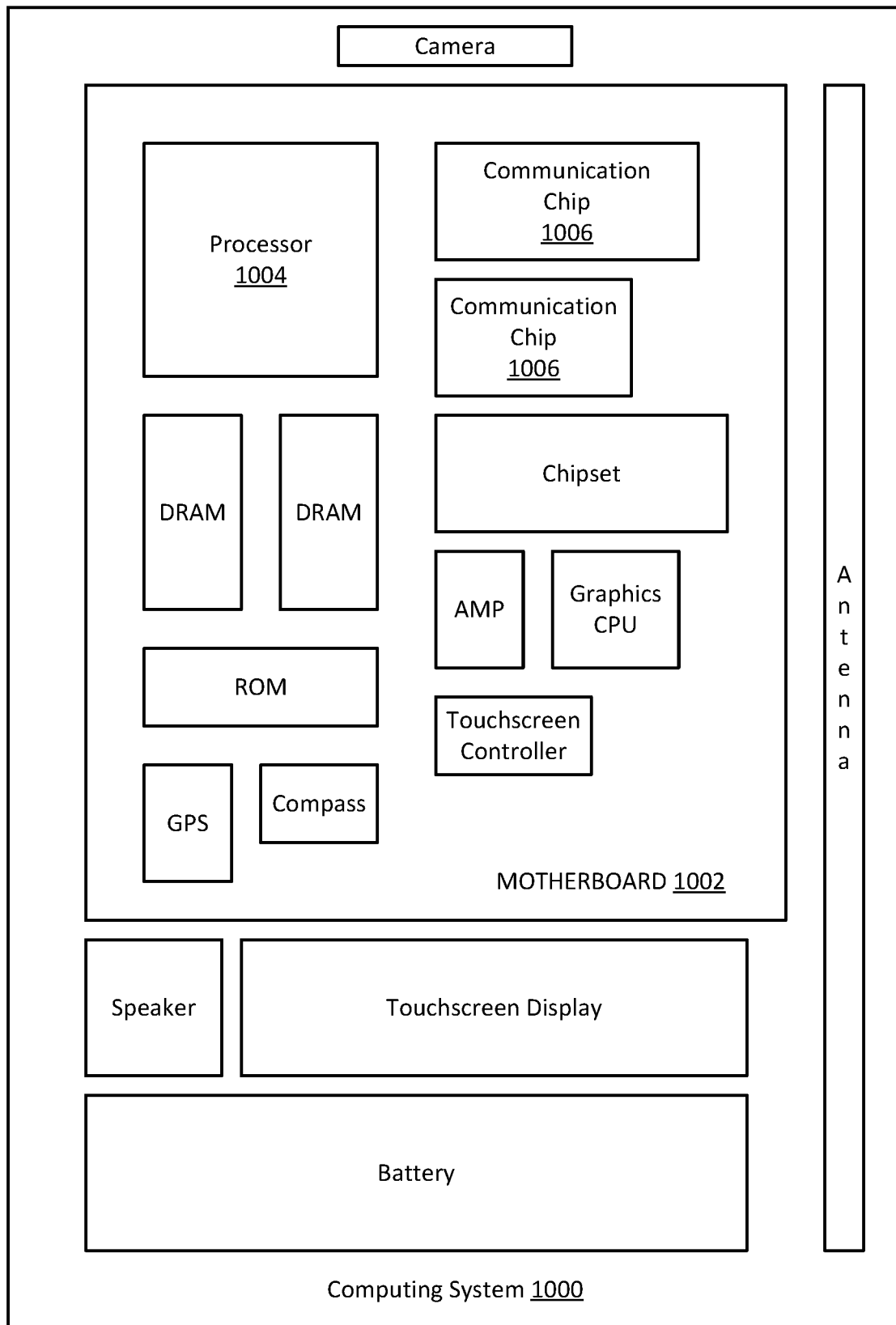
FIG. 6 illustrates a computing system implemented with integrated circuit structures or devices formed using the techniques disclosed herein, in accordance with an embodiment of the present disclosure.

FIG. 6 illustrates a computing system 1000 implemented with integrated circuit structures or devices formed using the techniques disclosed herein, in accordance with an example embodiment. As can be seen, the computing system 1000 houses a motherboard 1002. The motherboard 1002 may include a number of components, including, but not limited to, a processor 1004 and at least one communication chip 1006, each of which can be physically and electrically coupled to the motherboard 1002, or otherwise integrated therein. As will be appreciated, the motherboard 1002 may be, for example, any printed circuit board, whether a main board, a daughterboard mounted on a main board, or the only board of system 1000, etc.

Depending on its applications, computing system 1000 may include one or more other components that may or may not be physically and electrically coupled to the motherboard 1002. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 1000 may include one or more integrated circuit structures or devices formed using the disclosed techniques in accordance with an example embodiment. In some embodiments, multiple functions can be integrated into one or more chips (e.g., for instance, note that the communication chip 1006 can be part of or otherwise integrated into the processor 1004).

The communication chip 1006 enables wireless communications for the transfer of data to and from the computing system 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

The processor 1004 of the computing system 1000 includes an integrated circuit die packaged within the processor 1004. In some embodiments, the integrated circuit die of the processor includes onboard circuitry that is implemented with one or more integrated circuit structures or devices formed using the disclosed techniques, as variously described herein. The term "processor" may refer to any device or portion of a device that processes, for instance, electronic data from registers and/or memory to transform that electronic data into other electronic data that may be stored in registers and/or memory.

The communication chip 1006 also may include an integrated circuit die packaged within the communication chip 1006. In accordance with some such example embodiments, the integrated circuit die of the communication chip includes one or more integrated circuit structures or devices formed using the disclosed techniques as variously described herein. As will be appreciated in light of this disclosure, note that multi-standard wireless capability may be integrated directly into the processor 1004 (e.g., where functionality of any chips 1006 is integrated into processor 1004, rather than having separate communication chips). Further note that processor 1004 may be a chip set having such wireless capability. In short, any number of processor 1004 and/or communication chips 1006 can be used. Likewise, any one chip or chip set can have multiple functions integrated therein.

In various implementations, the computing device 1000 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device that processes data or employs one or more integrated circuit structures or devices formed using the disclosed techniques, as variously described herein.

FURTHER EXAMPLE EMBODIMENTS

The following examples pertain to further embodiments, from which numerous permutations and configurations will be apparent.

Example 1 is a transistor including: a substrate; a gate stack including a gate dielectric and gate electrode, the gate stack defining a channel region above and/or native to the substrate; and source and drain regions adjacent the channel region; wherein deuterium is present at an interface between the gate dielectric and the channel region.

Example 2 includes the subject matter of Example 1, wherein the channel region material includes at least one of silicon, germanium, and a III-V material.

Example 3 includes the subject matter of any of Examples 1-2, wherein the gate dielectric is at least one of silicon dioxide and a high-k dielectric material.

Example 4 includes the subject matter of any of Examples 1-3, wherein the channel region is native to the substrate.

Example 5 includes the subject matter of any of Examples 1-4, wherein the channel region has a finned configuration, the fin being native to the substrate and at least partially bordering a shallow trench isolation region, wherein deuterium is present at an interface between the fin and the shallow trench isolation region.

Example 6 includes the subject matter of any of Examples 1-3, wherein the channel region material is different than the substrate material.

Example 7 includes the subject matter of any of Examples 1-3 and 6, wherein the channel region is above the substrate and isolation material is between the channel region and the substrate.

Example 8 includes the subject matter of any of Examples 1-3 and 6-7, wherein the channel region has a nanowire configuration including at least one nanowire.

Example 9 includes the subject matter of any of Examples 1-4, wherein the channel region has a vertical channel configuration.

Example 10 is an integrated circuit including two transistors of any of Examples 1-7, wherein the channel regions of the two transistors both have finned configurations and wherein the height of one transistor fin is at least 1.5 times greater than the height of the other transistor fin.

Example 11 is a complementary metal-oxide-semiconductor (CMOS) device including the subject matter of any of Examples 1-9.

Example 12 is a computing system including the subject matter of any of Examples 1-9.

Example 13 is an integrated circuit including: a substrate; a first material above and/or native to the substrate, wherein the first material is a semiconductor material; and a second material bordering at least a portion of the first material, wherein the second material is at least one of an oxide and a high-k dielectric material; wherein deuterium is present at an interface between the first and second materials.

Example 14 includes the subject matter of Example 13, wherein the first material includes at least one of silicon, germanium, and a III-V material.

Example 15 includes the subject matter of any of Examples 13-14, wherein the second material is a high-k dielectric material.

Example 16 includes the subject matter of any of Examples 13-14, wherein the second material is silicon dioxide.

Example 17 includes the subject matter of any of Examples 13-16, wherein the first material is native to the substrate.

Example 18 includes the subject matter of any of Examples 13-16, wherein the first material is different than the substrate material.

Example 19 includes the subject matter of any of Examples 13-18, further including a third material bordering the second material, wherein the third material includes at least one metal.

Example 20 includes the subject matter of any of Examples 13-19, wherein the first material is at least partially a transistor channel and wherein the second material is a gate dielectric of the transistor.

Example 21 includes the subject matter of any of Examples 13-19, wherein the first material has a fin configuration and the second material is shallow trench isolation material on at least a portion of one side of the fin.

Example 22 includes the subject matter of any of Examples 13-20, wherein the first material is at least partially a transistor channel, the transistor geometry including at least one of a field-effect transistor (FET), metal-oxide-semiconductor FET (MOSFET), tunnel-FET (TFET), finned configuration, finFET configuration, trigate configuration, vertical channel configuration, nanowire configuration, nanoribbon configuration, and gate-all-around configuration.

Example 23 is a complementary metal-oxide-semiconductor (CMOS) device including the subject matter of any of Examples 13-22.

Example 24 is a computing system including the subject matter of any of Examples 13-22.

Example 25 is a method of forming a transistor, the method including: providing a substrate; forming a gate stack including a gate dielectric and gate electrode, the gate stack defining a channel region above and/or native to the substrate; and performing an anneal in an atmosphere including deuterium, wherein the deuterium passivates one or more impurities located at an interface between the gate dielectric and the channel region.

Example 26 includes the subject matter of Example 25, wherein the anneal is performed at pressures of 1 to 50 atmospheres.

Example 27 includes the subject matter of any of Examples 25-26, wherein the anneal is performed at pressures of greater than 20 atmospheres.

Example 28 includes the subject matter of any of Examples 25-27, wherein the anneal is performed at temperatures of less than 450° C.

Example 29 includes the subject matter of any of Examples 25-28, wherein the anneal is performed during or after back-end processing of the transistor.

Example 30 includes the subject matter of any of Examples 25-29, wherein the channel region material includes at least one of silicon, germanium, and a III-V material.

Example 31 includes the subject matter of any of Examples 25-30, wherein the gate dielectric is at least one of silicon dioxide and a high-k dielectric material.

Example 32 includes the subject matter of any of Examples 25-31, wherein the channel region is native to the substrate.

Example 33 includes the subject matter of any of Examples 25-32, wherein the channel region has a finned configuration, the fin being native to the substrate and at least partially bordering a shallow trench isolation region, and wherein the deuterium passivates one or more impurities located at an interface between the fin and the shallow trench isolation region.

Example 34 includes the subject matter of any of Examples 25-31, wherein the channel region material is different than the substrate material.

Example 35 includes the subject matter of any of Examples 25-31, wherein the channel region is above the substrate and isolation material is between the channel region and the substrate.

Example 36 includes the subject matter of any of Examples 25-35, wherein the transistor geometry includes at least one of a field-effect transistor (FET), metal-oxide-semiconductor FET (MOSFET), tunnel-FET (TFET), finned configuration, finFET configuration, trigate configuration, vertical channel configuration, nanowire configuration, nanoribbon configuration, and gate-all-around configuration.

The foregoing description of example embodiments has been presented for the purposes of illustration and description. It is not intended to be exhaustive or to limit the present disclosure to the precise forms disclosed. Many modifications and variations are possible in light of this disclosure. It is intended that the scope of the present disclosure be limited not by this detailed description, but rather by the claims appended hereto. Future filed applications claiming priority to this application may claim the disclosed subject matter in a different manner, and may generally include any set of one or more limitations as variously disclosed or otherwise demonstrated herein.

What is claimed is:

1. An integrated circuit comprising:
a fin structure comprising an upper region, a lower region, and a middle region between the upper and lower regions, wherein the fin structure further includes a sub-region below the lower region, the sub-region having sides that are in contact with regions of insulator material; and
a gate structure wrapped around the middle region of the fin structure and not wrapped around the lower region or the upper region of the fin structure, wherein the gate structure includes a gate electrode and a gate dielectric, the gate dielectric wrapped around the middle region of the fin structure, and the gate electrode wrapped around the gate dielectric;
wherein deuterium is present along the entire interface between the gate dielectric and the middle region of the fin structure, and wherein deuterium is present at side interfaces between the sub-region of the fin and the regions of insulator material.

2. The integrated circuit of claim 1, wherein at least the middle region of the fin structure comprises one or both of silicon and germanium.

3. The integrated circuit of claim 1, wherein the upper and lower regions have a first material composition, and the middle region has a second material composition that is different from the first material composition.

4. A computing system comprising the integrated circuit of claim 1.

5. An integrated circuit comprising:
a substrate;
a fin structure extending from the substrate, wherein the fin structure comprises an upper region, a lower region, a middle region between the upper and lower regions, and a sub-region beneath the lower region; and
a gate structure wrapped around the middle region of the fin structure, wherein the gate structure includes a gate electrode and a gate dielectric, the gate dielectric wrapped around the middle region of the fin structure, and the gate electrode wrapped around the gate dielectric;
wherein deuterium is present along the entire interface between the gate dielectric and the middle region of the fin structure;
wherein sides of the sub-region are in contact with regions of insulator material; and
wherein deuterium is present at side interfaces between the sub-region of the fin and the regions of insulator material.

6. The integrated circuit of claim 5, wherein the upper region is one of a source or drain region of a vertical transistor, and the lower region is the other one of the source or drain region of the vertical transistor.

7. The integrated circuit of claim 1, wherein hydrogen is also present along the entire interface between the gate dielectric and the middle region of the fin structure.

8. The integrated circuit of claim 1, wherein deuterium is present within the gate dielectric.

9. The integrated circuit of claim 5, wherein hydrogen is also present along the entire interface between the gate dielectric and the middle region of the fin structure.

10. The integrated circuit of claim 5, wherein at least the middle region of the fin structure comprises one or both of silicon and germanium.

11. The integrated circuit of claim 5, wherein deuterium is present within the gate dielectric.

12. An integrated circuit comprising:
a fin structure comprising an upper region, a lower region, a middle region between the upper and lower regions, and a sub-region beneath the lower region; and
a gate structure wrapped around the middle region of the fin structure and not wrapped around the lower region or the upper region of the fin structure, wherein the gate structure includes a gate electrode and a gate dielectric, the gate dielectric wrapped around the middle region of the fin structure, and the gate electrode wrapped around the gate dielectric;
wherein deuterium is present along the interface between the gate dielectric and the middle region of the fin structure; and
wherein deuterium is present at side interfaces between the sub-region of the fin and regions of insulator material in contact with the sub-region of the fin.

13. The integrated circuit of claim 12, wherein deuterium is present within the gate dielectric.

14. The integrated circuit of claim 12, wherein the upper region is one of a source or drain region of a vertical transistor, and the lower region is the other one of the source or drain region of the vertical transistor.

15. The integrated circuit of claim 12, wherein hydrogen is also present along the interface between the gate dielectric and the middle region of the fin structure.

16. The integrated circuit of claim 12, wherein at least the middle region of the fin structure comprises one or both of silicon and germanium.

17. The integrated circuit of claim 12, further comprising a substrate, wherein the fin structure is compositionally different than the substrate.

* * * * *